United States Patent
Gollier et al.

(10) Patent No.: US 7,414,778 B1
(45) Date of Patent: Aug. 19, 2008

(54) WAVELENGTH CONVERSION DEVICES AND FABRICATION METHODS FOR SAME

(75) Inventors: Jacques Gollier, Painted Post, NY (US); Garrett Andrew Piech, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/978,864

(22) Filed: Oct. 30, 2007

(51) Int. Cl.
*G02F 1/35* (2006.01)
*H01S 3/10* (2006.01)

(52) U.S. Cl. ........................................ 359/326; 372/22
(58) Field of Classification Search ......... 359/326–330; 372/21, 22
See application file for complete search history.

(56) References Cited

U.S. PATENT DOCUMENTS

| | | | |
|---|---|---|---|
| 7,123,792 B1 | 10/2006 | Mears et al. | 385/37 |
| 2004/0252733 A1 | 12/2004 | Huang | 372/22 |
| 2006/0233206 A1 | 10/2006 | Miner et al. | 372/22 |
| 2007/0002909 A1* | 1/2007 | Furukawa et al. | 372/22 |
| 2007/0153850 A1* | 7/2007 | Scripsick et al. | 372/39 |

FOREIGN PATENT DOCUMENTS

JP    2006-332447    12/2006

OTHER PUBLICATIONS

Demonstration and optical characteristics of electro-optic Bragg modulators in periodically poled lithium niobate in the near-infared, J. A. Abernethy, et al Applied Physics Letters vol. 81, No. 14, Sep. 30, 2002 pp. 2514-2516.

* cited by examiner

*Primary Examiner*—Hemang Sanghavi
(74) *Attorney, Agent, or Firm*—Gregory V. Bean; Dinsmore & Shohl, LLP

(57) ABSTRACT

Particular embodiments of the present invention relate generally to a method of fabricating a wavelength conversion device. According to the method, the wavelength conversion device is fabricated by providing a nonlinear optical material and poling the nonlinear optical material to form a plurality of periodically inverted poling domains arranged at an anti-back reflective periodicity $\Lambda$. The geometry and the anti-back reflective periodicity $\Lambda$ of the poled nonlinear material are selected such that the difference between a phase matching wavelength $\lambda_\Phi$ of the poled nonlinear optical material and a Bragg wavelength $\lambda_{BRAGG}$ of the poled nonlinear optical material is greater than 1 nm.

17 Claims, 2 Drawing Sheets

WAVELENGTH CONVERSION DEVICES AND FABRICATION METHODS FOR SAME

BACKGROUND OF THE INVENTION

The present invention relates generally to wavelength conversion devices and fabrication methods of the same. More particularly, some embodiments of the present invention relate to a fabrication method for a wavelength conversion device that introduces a poling period within the wavelength conversion device such that the wavelength of the phase matching signal is sufficiently different than the Bragg wavelength.

SUMMARY OF THE INVENTION

The present invention relates generally to wavelength conversion devices, such as second harmonic generation crystals (SHG), which may be usefully configured with semiconductor lasers in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, a vertical cavity surface-emitting laser (VCSEL), a vertical external cavity surface-emitting laser (VECSEL) or a Fabry-Perot laser with a light wavelength conversion device, such as a SHG crystal. The wavelength conversion device can be configured to generate higher harmonic waves of the fundamental laser signal by tuning, for example, a 1060 nm DBR or DFB laser to the spectral center of the wavelength conversion device, which converts the wavelength to 530 nm. However, in such a higher harmonic wave generating system, an important parameter is the wavelength stability of the laser. The wavelength conversion efficiency of a wavelength conversion device, such as MgO-doped periodically poled lithium niobate (PPLN), is strongly dependent on the wavelength matching between the laser diode and the wavelength conversion device. The conversion efficiency of the wavelength conversion device is a very narrow function of the wavelength so that any wavelength instability generates intensity fluctuations of the frequency doubled light.

The present inventors have found that back reflections coming from the wavelength conversion device and re-injected into the semiconductor laser play a key role for wavelength stability. Lasers such as DBR lasers are very sensitive to feedback and can become unstable in wavelength with feedback levels as low as −60 to −70 dB. For example, Bragg gratings may cause back reflections in a laser system. The present inventors have also found that, although a wavelength conversion device such as an SHG crystal may not intentionally comprise Bragg gratings in a DFB laser system, the bulk of the SHG crystal presents some periodic or nearly periodic features such as the crystal poling or other features associated with the way that the crystal waveguide is made. These features may act like unwanted Bragg gratings and generate some significant feedback to the laser diode.

Given the challenges associated with wavelength matching and stabilization in developing semiconductor laser sources, the present inventors have recognized a method to fabricate a wavelength conversion device to minimize back reflections from the wavelength conversion device to a semiconductor laser, thereby increasing semiconductor laser wavelength stability.

The present inventors have recognized that although the concepts of the present invention are described primarily in the context of use with DBR lasers, it is contemplated that the control schemes discussed herein will also have utility in a variety of types of semiconductor lasers, including but not limited to DFB lasers, Fabry-Perot lasers, VCSELS, VECSELS and many other types of external cavity lasers.

According to one embodiment of the present invention, a method of fabricating a wavelength conversion device is provided. According to the method, the wavelength conversion device is fabricated by shaping a nonlinear optical material and poling the nonlinear optical material to form a plurality of periodically inverted poling domains arranged at an anti-back reflective periodicity $\Lambda$. The geometry and the anti-back reflective periodicity $\Lambda$ of the poled nonlinear optical material is selected such that the difference between a phase matching wavelength $\lambda_\Phi$ of the poled nonlinear optical material and a Bragg wavelength $\lambda_{BRAGG}$ of the poled nonlinear optical material is greater than 1 nm over an operational temperature range.

According to an additional embodiment of the present invention, a method of fabricating a wavelength conversion device is provided. According to the method, a wavelength conversion device is fabricated such that a phase matching wavelength $\lambda_\Phi$ is never equal to the Bragg wavelength $\lambda_{BRAGG}$ at any possible combination of the indices of refraction of the wavelength conversion device, including higher order modes and cross polarization.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
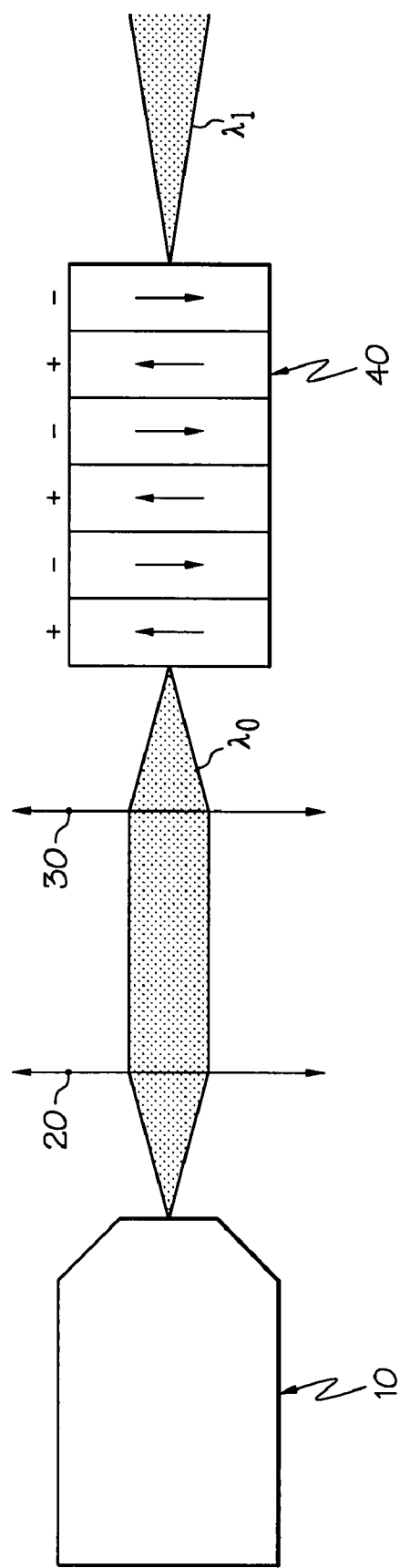
FIG. 1 is a schematic illustration of a DBR or similar type semiconductor laser optically coupled to a light wavelength conversion device.

In FIG. 1, the DBR laser 10 is optically coupled to a light wavelength conversion device 40 comprising a nonlinear optical material. As will be appreciated by those familiar with laser design, DFB lasers are resonant-cavity lasers using grids or similar structures etched into the semiconductor material as a reflective medium. DBR lasers are lasers in which the etched Bragg grating is physically separated from the electronic pumping area of the semiconductor laser. On the other hand, a Fabry-Perot laser has no wavelength selective section and, therefore generates multiple wavelengths. To operate the Fabry-Perot laser in single mode, it is therefore necessary to introduce a wavelength selective component into the optical path to reflect some light towards the diode and stabilize the wavelength. This function can be achieved by integrating a Bragg grating over a portion of a periodically poled lithium niobate (PPLN) crystal waveguide. It is contemplated that these and other types of lasers may be utilized with the present invention.

The input optical signal of wavelength $\lambda_0$ emitted by the semiconductor laser 10 can be either directly coupled into the wavelength conversion device 40 or can be coupled through collimating and focusing optics 20, 30 or some other type of suitable optical element or optical system. The wavelength conversion device 40 converts the input optical signal wavelength $\lambda_0$ emitted by the semiconductor laser 10 into higher harmonic waves. This type of configuration is particularly useful in generating shorter wavelength laser beams from longer wavelength semiconductor lasers and can be used, for example, as a visible laser source for laser projection systems. The input optical signal $\lambda_0$ may comprise wavelengths of visible light, infrared, near-infrared and ultra-violet, for example.

The wavelength conversion device 40 is illustrated in FIG. 1 as a nonlinear, second harmonic generator (SHG) crystal. The input optical signal with a wavelength $\lambda_0$ and a frequency $\omega_0$ is passed into an input face of the wavelength conversion device 10 and propagates along an optical path toward the output face. The optical path is any path taken by light within the wavelength conversion device. An output optical signal of a doubled frequency $2\omega_0$ emerges from the output face of the wavelength conversion device 40. For example, the wavelength conversion device 40 can be configured to generate higher harmonic waves of the fundamental laser signal by tuning, for example, a 1060 nm DBR or DFB laser to the spectral center of the wavelength conversion device 40, which converts the wavelength to 530 nm.

Although the wavelength conversion device 40 creates signals of a frequency that are double the frequency of the original optical signal, these signals are out of phase with one another. For example, a second-harmonic light signal that is generated near the input face of the wavelength conversion device 40 will be out of phase with a second-harmonic light signal that is generated near the output face of the wavelength conversion device. To obtain constructive phasematching between the second-harmonic light signals that are generated in the wavelength conversion device, quasi-phasematching is employed. Quasi-phasematching may be achieved by introducing periodically inverted poling domains within the nonlinear material. The poling consists of periodically inverting the orientation of the crystallographic axis of the wavelength conversion device in order to insure that both infrared and visible light stay nearly in phase along the propagation of the wavelength conversion device. By introducing a phase shift at each domain, a resultant phase correction is achieved. Nonlinear optical materials suitable for a SHG crystal may include, but is not limited to, PPLN, periodically poled lithium tantalate (PPLT), and periodically poled potassium titanyl phosphate (PPKTP). Poling may be induced into the wavelength conversion device 40 by many processes, including, for example, electron beam scanning, application of an electric field, or growth of the crystal.

The wavelength conversion efficiency of the wavelength conversion device 40 illustrated in FIG. 1 is dependent on the wavelength matching between the semiconductor laser 10 and the wavelength conversion device 40. The output power of the higher harmonic light wave generated in the wavelength conversion device 40 drops drastically when the output wavelength of the laser 10 deviates from the wavelength conversion bandwidth of the wavelength conversion device 40.

The present inventors have recognized the challenges in addressing the instability of the emission wavelength of a semiconductor laser resulting from back reflections from the wavelength conversion device to the semiconductor laser. In applications involving a laser 10 such as a DBR laser as the source and a PPLN crystal as a wavelength conversion device 40 for frequency doubling, it is desirable that the light does not get reflected on itself and coupled back into the laser diode. External cavity feedback can make the laser become very unstable in wavelength. The conversion efficiency of the wavelength conversion device 40 is very sensitive to wavelength variations. As a consequence, feedback can create significant fluctuations of the frequency doubled power.

Additionally, in applications such as non linear frequency doubling, a laser diode having the highest possible power, such as several hundred milliwatts, is required to achieve sufficient conversion efficiencies. One way to achieve such high power in single mode lasers consists of decreasing the reflectivity of the front facet of the laser as low as possible to minimize the power density inside the laser cavity. However, the drawback of decreasing the front facet reflectivity is that it makes the laser more sensitive to back reflections. Feedback amplitudes as low as −60 to −70 dB's is enough to start generating some wavelength instabilities.

Bragg-like gratings within the wavelength conversion device 40 may cause significant feedback to the laser 10. These Bragg-like gratings result from the poling and indices of refraction of the wavelength conversion device 40. Where a DBR or DFB laser 10 is used to pump the wavelength conversion device 40, the laser diode itself includes a Bragg grating. In this case, the wavelength conversion device 40 does not intentionally comprise a Bragg grating. However, SHG and other similar crystals possess inherent and undesirable Bragg gratings that are a result of the poling process. For example, local stress may be introduced into the wavelength conversion device 40 during the poling process which may result in a variation of the index of refraction. Additionally, any residual voltage resulting from the poling process may generate a different index of refraction for the regions that are poled and not poled. Non-perfect local inversion of the crystal may create scattering centers in the structure. These periodic scattering structures may generate resonances in a similar manner as an index variation Bragg grating. The Bragg resonances within the wavelength conversion device 40 cause significant back reflections and create instability in the laser 10.

The present inventors have recognized that the power that gets back reflected from the wavelength conversion device 40 is a function of the wavelength of the phase matching wavelength $\lambda_\Phi$, which is the wavelength of the laser 10 where optimum nonlinear conversion occurs, and the wavelength of the Bragg resonance (the Bragg wavelength $\lambda_{BRAGG}$) of the wavelength conversion device 40. Where the phase matching wavelength $\lambda_\Phi$ is significantly different from the Bragg wavelength $\lambda_{BRAGG}$, the amount of back reflections is negligible and the laser 10 remains stable. However, where the wavelength of the laser 10 matches the Bragg wavelength $\lambda_{BRAGG}$, back reflections suddenly increase and the laser diode becomes unstable. Multiple resonance instances may occur at once due to a resonance happening on different electromagnetic modes that propagate in the wavelength conversion device.

Figure 2:
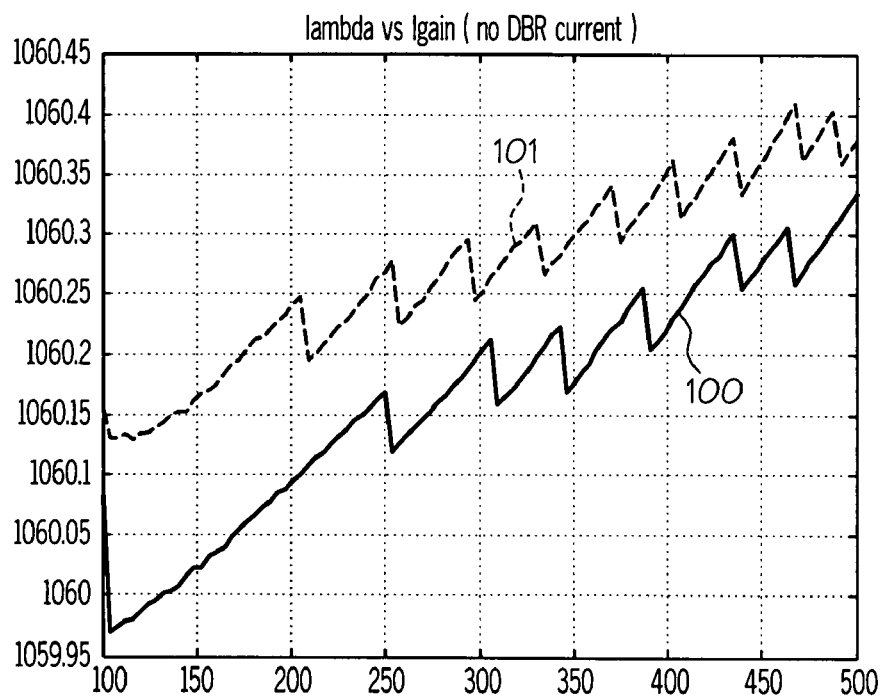
FIGS. 2 and 3 illustrate the evolution of emission wavelength as a function of gain current in a DBR laser.
Figure 3:
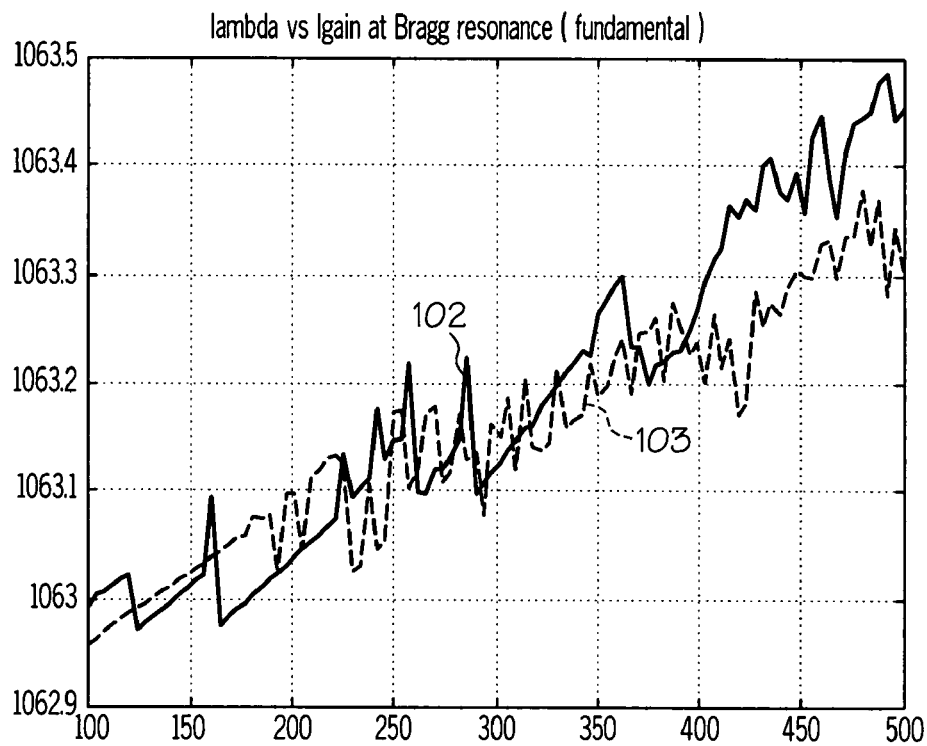

FIGS. 2 and 3 illustrate the impact of the back reflections on the stability of the laser. FIG. 2 illustrates the source wavelength as a function of the current in the gain section of the laser 10 (about 1060 nm). The solid line 100 corresponds to a first laser diode package while the dashed line 101 corresponds to a second laser diode package. The wavelength of the lasers remain relatively stable, although there is a gradual increase of the wavelength with some sudden fluctuations associated with the mode hop of the laser. On the other hand, FIG. 3 illustrates the source wavelength of the first laser package 102 and the second laser package 103 adjusted close to the Bragg resonance (about 1063 nm). As can be seen in FIG. 3, both laser diode packages experience significant instability due to back reflections from the wavelength conversion device 40 resulting from the source wavelength being close to the Bragg wavelength $\lambda_{BRAGG}$. Therefore, to avoid back reflections, the wavelength conversion device 40 must be designed and fabricated in such a way that the Bragg resonance does not occur at the phase matching $\lambda_\Phi$.

As noted above, particular embodiments of the present invention generally relate to the fabrication of a wavelength conversion device to minimize back reflections from the wavelength conversion device 40 to a semiconductor laser 10. More specifically, the present inventors have recognized that altering the poling period of the wavelength conversion device will insure that the Bragg wavelength $\lambda_{BRAGG}$ is significantly different than the laser wavelength.

To ensure stable wavelength operation, the design parameters of the wavelength conversion device 40 may be chosen such that the wavelength where the Bragg reflection happens is very far away from the phase matching wavelength $\lambda_\Phi$. The design parameters of the wavelength conversion device 40 include the poling period and the forward and backward propagating effective indices of refraction at the input frequency (or wavelength). The poling period of the wavelength conversion device must be selected and induced into the wavelength conversion device 40 at an anti-back reflective periodicity $\Lambda$ such that the Bragg wavelength $\lambda_{BRAGG}$ and the phasematching wavelength $\lambda_\Phi$ are significantly different. The phase matching wavelength $\lambda_\Phi$ is a function of the anti-back reflective periodicity $\Lambda$, a forward propagating effective index of refraction $\eta_F$ at the input frequency (or wavelength), and a backward propagating effective index of refraction $\eta_B$ at the input frequency (or wavelength). The Bragg wavelength $\lambda_{BRAGG}$ is a function of the anti-back reflective periodicity $\Lambda$, a converted frequency effective index of refraction $\eta_{2\upsilon}$, and an input frequency effective index of refraction $\eta_{IN}$.

More specifically, the Bragg wavelength $\lambda_{BRAGG}$ is defined as $$\lambda_{BRAGG} = \Lambda(\eta_F + \eta_B)k;\text{ and}$$

the phase matching wavelength $\lambda_\Phi$ is defined as $$\lambda_\Phi = 2\Lambda(\eta_{2\upsilon} - \eta_{IN})$$

where $\Lambda$ is the anti-back reflective periodicity of the poled nonlinear optical material;

$\eta_F$ is the forward propagating effective index of refraction of the poled nonlinear optical material at the input frequency;

$\eta_B$ is the backward propagating effective index of refraction of the poled nonlinear optical material at the input frequency;

$\eta_{2\upsilon}$ is the converted frequency effective index of refraction of the poled nonlinear optical material;

$\eta_{IN}$ is the input frequency effective index of refraction of the poled nonlinear optical material; and k is a positive integer.

Therefore, an anti-back reflective periodicity $\Lambda$ must be selected such that the two above equations are not equal to one another. The present inventors have recognized that the difference between the Bragg wavelength $\lambda_{BRAGG}$ and the phase matching wavelength $\lambda_\Phi$ should be greater than 1 nm. To determine how much the phase matching wavelength $\lambda_\Phi$ and the Bragg wavelength $\lambda_{BRAGG}$ need to be separated, operational temperature should be taken into consideration. When the system is operated over large operational temperatures, it is important to insure that both the phase matching wavelength $\lambda_\Phi$ and the Bragg wavelength $\lambda_{BRAGG}$ remain separated over the entire temperature range. In most periodically poled crystals, the present inventors have recognized that the thermal sensitivity of the Bragg wavelength $\lambda_{BRAGG}$ is significantly different from the thermal sensitivity of the phase matching wavelength $\lambda_\Phi$. The consequence is that both wavelengths can be separated at room temperature but not at higher or lower temperatures, for example. The following formula shows the condition that needs to be matched over the entire temperature range:

$$ABS((\lambda_{BRAGG} + d\lambda_B/dt*(T-T_{AMB})) - (\lambda_\Phi + d\lambda_\Phi/dt*(T-T_{AMB}))) > 1\text{ nm}$$

Where $d\lambda_B/dt$ is the thermal sensitivity of the Bragg wavelength $\lambda_{BRAGG}$ in nm/C.°, $d\lambda_D/dt$ is the thermal sensitivity of the phase matching wavelength in nm/C.°, T is the temperature, and $T_{AMB}$ is the ambient temperature As an example and not a limitation, by using this formula for a PPLN crystal operated at 1060 nm at room temperature, and assuming −20 C.° to +65 C.° as the operational temperature, the Bragg wavelength $\lambda_{BRAGG}$ at room temperature should be larger than 1063.3 nm or smaller than 1056.9 nm. This condition should be matched for all combinations of indices of refraction in the Bragg wavelength $\lambda_{BRAGG}$ formula above.

The various indices of refraction in the phase matching wavelength $\lambda_\Phi$ and the Bragg wavelength $\lambda_{BRAGG}$ equations above represent the effective index of refraction in the wavelength conversion device 40. Multiple cases should be considered to cover all possible resonant wavelengths. The wavelength conversion device 40 is relatively large and the index of refraction contrast between the core and the cladding of the wavelength conversion device 40 is also large. Therefore, multiple modes can be totally or partly guided. Because multiple modes are propagating at different speeds in the wavelength conversion device 40, each of them have a different effective indices. Because the Bragg resonance can create some mode mixing, especially if Bragg is created by a scattering effect, all possible combinations of effective indices should be taken into account.

Additionally, the Bragg resonance can also create some polarization coupling, especially if the Bragg resonance is created by scattering. When using birefringent materials such as PPLN, it is important to also consider index combinations of the ordinary and extraordinary index, which may be significantly different. Therefore, all possible combinations of effective indices of refraction corresponding to all forward and backward propagating modes as well as all polarization directions should be considered when determining the Bragg wavelength $\lambda_{BRAGG}$.

In terms of the periodic features that can create a Bragg reflection, multiple parameters should be taken into consideration. The first period to consider is the crystal poling period which, for a PPLN crystal operated at 1060 nm, for example, creates multiple Bragg resonance separated by approximately 40 nm.

However, in some other cases, the poling of the crystal may not be completely periodic. Because of current manufacturing constraints, the poling must be chosen between discreet values that are a multiple of a tenth of one micron (for example, 6.5/6.6/6.7 . . . microns). When a specific wavelength is desired, it is sometimes necessary to select a period that is between two available values. To achieve that goal, a well known method consists of using a pseudo-periodic poling. As an example and not a limitation, to create a poling with an equivalent period of 6.55 microns, the poling can be made by the repetition of 6.5+6.6 microns which gives an average of 6.55 microns. In terms of Bragg resonance, the period to take into consideration is then 13.1 microns. The resulting impact is that the distance between the Bragg resonances is divided by a factor of 2, which makes it harder to avoid equating the Bragg wavelength $\lambda_{BRAGG}$ with the phase matching wavelength $\lambda_\Phi$. As an example, with a PPLN crystal operated at 1060 nm, the Bragg resonances are separated by 20 nm instead of the traditional 40 nm for a purely periodic poling.

Another parameter to be taken into consideration is linked to the way that the wavelength conversion device 40 is formed or shaped. For example, where laser ablation technology is used to shape the nonlinear optical material, a periodic structure resulting from fabrication can be created. Laser ablation consists of scanning a pulsed laser on the material to create the edges of the wavelength conversion device 40. Such an approach can then create a periodic structure of a periodicity that is given by the scanning speed times the period of the pulses. This period may be easily modified by slightly modifying either the laser pulse period or the scanning speed. Adjusting the Bragg resonance associated with that nearly periodic feature is therefore relatively simple.

In designing a wavelength conversion device 40 comprising a PPLN crystal, for example, according to these rules, the first step of optimization consists in fixing the waveguide geometry and materials as well as the poling period to meet the phase matching at the desired wavelength. Based on these parameters, the positions of Bragg resonances corresponding to all combinations are verified. More specifically, in the case of green laser optimized around 530 nm, it appears that the combination between the ordinary and extraordinary indices give a Bragg resonance too close to the 1060 nm wavelength of the laser.

The next step in the optimization consists of selecting other parameters such as the waveguide geometry, the waveguide index contrast or the poling period and the nominal wavelength to insure enough separation between the phase matching wavelength $\lambda_\Phi$ and the Bragg wavelength $\lambda_{BRAGG}$. Note that the result of the first iteration can be used as an input to the second iteration. By knowing the position of the Bragg resonance, one can determine the exact effective index of the modes in the IR. Also, by knowing the phase matching wavelength $\lambda_\Phi$ one can deduce the index of refraction in the frequency doubled wavelength. Based on this data, it is possible to accurately determine how to change the parameters to avoid the Bragg resonance. Once the geometry of the waveguide and the index contrast are selected, it is desirable to only modify the poling periodicity and the phasematching wavelength $\Phi_\Phi$ to meet the desired Bragg resonance condition.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method of fabricating a wavelength conversion device, the method comprising:
   shaping a nonlinear optical material into a geometry that defines an input face, an output face, and an optical path extending from the input face to the output face; and
   poling the nonlinear optical material to form a plurality of periodically inverted poling domains arranged at an anti-back reflective periodicity $\Lambda$, wherein
      the geometry and the anti-back reflective periodicity $\Lambda$ of the poled nonlinear optical material is selected such that the difference between a phase matching wavelength $\lambda_\Phi$ of the poled nonlinear optical material and a Bragg wavelength $\lambda_{BRAGG}$ of the poled nonlinear optical material is greater than 1 nm over an operational temperature range,
      the Bragg wavelength $\lambda_{BRAGG}$ is a function of the anti-back reflective periodicity $\Lambda$ of the poled nonlinear optical material, a forward propagating effective index of refraction $\eta_F$ of the poled nonlinear optical material, and a backward propagating effective index of refraction $\eta_B$ of the poled nonlinear optical material, and
      the phase matching wavelength $\lambda_\Phi$ is a function of the anti-back reflective periodicity $\Lambda$ of the poled nonlinear optical material, a converted frequency effective index of refraction $\eta_{2\upsilon}$ of the poled nonlinear optical material and an input frequency effective index of refraction $\eta_{IN}$ of the poled nonlinear optical material.

2. A method as claimed in claim 1 wherein:
   the Bragg wavelength $\lambda_{BRAGG}$ is defined as $\lambda_{BRAGG}=\Lambda(\eta_F+\eta_B)/k$; and the phase matching wavelength $\lambda_\Phi$ is defined as $\lambda_\Phi=2\Lambda(\eta_{2\upsilon}-\eta_{IN})$;

where
      $\Lambda$ is the anti-back reflective periodicity of the poled nonlinear optical material;
      $\eta_F$ is the forward propagating effective index of refraction of the poled nonlinear optical material at the input frequency;
      $\eta_B$ is the backward propagating effective index of refraction of the poled nonlinear optical material at the input frequency;
      $\eta_{2\upsilon}$ is the converted frequency effective index of refraction of the poled nonlinear optical material;
      $\eta_{IN}$ is the input frequency effective index of refraction of the poled nonlinear optical material; and
      k is a positive integer.

3. A method as claimed in claim 1 wherein the difference between the phase matching wavelength $\lambda_\Phi$ and the Bragg wavelength $\lambda_{BRAGG}$ over the operational temperature range is calculated by:

$$ABS((\lambda_{BRAGG}+d\lambda_B/dt*(T-T_{AMB}))-(\lambda_\Phi+d\lambda_\Phi/dt*(T-T_{AMB})))>1 \text{ nm}$$

where $d\lambda_B/dt$ is the thermal sensitivity of the Bragg wavelength $\lambda_{BRAGG}$ in nm/C.°;

$d\lambda_\Phi/dt$ is the thermal sensitivity of the phase matching wavelength in nm/C.°;

T is the temperature; and $T_{AMB}$ is the ambient temperature.

4. A method as claimed in claim 1 wherein there is no Bragg resonance within the interval of 3.1 nm below the phasematching wavelength $\lambda_\Phi$ to 3.3 nm above the phase-matching wavelength $\lambda_\Phi$.

5. A method as claimed in claim 1 wherein the nonlinear optical material is performed by laser ablation.

6. A method as claimed in claim 5 wherein a laser ablation scanning speed and a laser ablation pulse frequency are selected such that the difference between the phase matching wavelength $\lambda_\Phi$ of the poled nonlinear optical material and the Bragg wavelength $\lambda_{BRAGG}$ of the poled nonlinear optical material is greater than 1 nm over the operational temperature range.

7. A method as claimed in claim 2 wherein all combinations of indices of refraction corresponding to all forward and backward propagation modes and polarization directions are considered in determining the Bragg wavelength $\lambda_{BRAGG}$.

8. A method as claimed in claim 3 wherein all combinations of indices of refraction corresponding to all forward and backward propagation modes and polarization directions are considered in determining the Bragg wavelength $\lambda_{BRAGG}$.

9. A method as claimed in claim 1 wherein the wavelength conversion device is configured to double the frequency of an input optical signal incident on the input face of the wavelength conversion device.

10. A method as claimed in claim 1 wherein the anti-back reflective periodicity $\Lambda$ is selected such that the difference between the phase matching wavelength $\lambda_\Phi$ of the poled nonlinear optical material and the Bragg wavelength $\lambda_{BRAGG}$ of the poled nonlinear optical material is greater than 1 nm for an input optical signal of between approximately 760 nm and approximately 1250 nm incident on the input face of the wavelength conversion device.

11. A method as claimed in claim 1 wherein the anti-back reflective periodicity $\Lambda$ is selected to minimize Bragg grating-like back reflections from the wavelength converting device to a semiconductor laser.

12. A method as claimed in claim 1 wherein the anti-back reflective periodicity $\Lambda$ is selected such that the difference between the phase matching wavelength $\lambda_\Phi$ and an integer multiple of the Bragg wavelength $\lambda_{BRAGG}$ is at least approximately 2 nm.

13. A method as claimed in claim 1 wherein the poling of the nonlinear optical material is induced by electron beam scanning, application of an electric field, or during growth of the nonlinear optical material.

14. A method as claimed in claim 1 wherein the nonlinear optical material comprises periodically poled lithium niobate.

15. A method of fabricating a wavelength conversion device, the method comprising:

shaping a nonlinear optical material into a geometry that defines an input face, an output face, and an optical path extending from the input face to the output face; and poling the nonlinear optical material to form a plurality of periodically inverted poling domains arranged at an anti-back reflective periodicity $\Lambda$, wherein the geometry and the anti-back reflective periodicity $\Lambda$ of the poled nonlinear optical material is selected such that the difference between a phase matching wavelength $\lambda_\Phi$ of the poled nonlinear optical material and a Bragg wavelength $\lambda_{BRAGG}$ of the poled nonlinear optical material is greater than 1 nm over an operational temperature range, wherein the Bragg wavelength $\lambda_{BRAGG}$ is defined as $$\lambda_{BRAGG}=\lambda(\eta_F+\eta_B)/k;$$

the phase matching wavelength $\lambda_\Phi$ is defined as $$\lambda_\Phi=2\Lambda(\eta_{2\upsilon}-\eta_{IN});$$

where $\Lambda$ is the anti-back reflective periodicity of the poled nonlinear optical material;

$\eta_F$ is a forward propagating effective index of refraction of the poled nonlinear optical material at the input frequency;

$\eta_B$ is a backward propagating effective index of refraction of the poled nonlinear optical material at the input frequency;

$\eta_{2\upsilon}$ is a converted frequency effective index of refraction of the poled nonlinear optical material;

$\eta_{IN}$ is an input frequency effective index of refraction of the poled nonlinear optical material; and k is a positive integer; and the phase matching wavelength $\lambda_\Phi$ a is never equal to the Bragg wavelength $\lambda_{BRAGG}$ at any possible combination of the forward propagating effective index of refraction $\eta_F$ of the poled nonlinear optical material, the backward propagating effective index of refraction $\eta_B$ of the poled nonlinear optical material, the converted frequency effective index of refraction $\eta_{2\upsilon}$ of the poled nonlinear optical material, and the input frequency effective index of refraction $\eta_{IN}$ of the poled nonlinear optical material.

16. A method as claimed in claim 15 wherein the difference between the phase matching wavelength $\lambda_\Phi$ and the Bragg wavelength $\lambda_{BRAGG}$ over the operational temperature range is calculated by:

$$ABS((\lambda_{BRAGG}+d\lambda_B/dt*(T-T_{amb}))-(\lambda_\Phi+d\lambda_\Phi/dt+(T-T_{amb})))>1 \text{ nm}$$

where $d\lambda_B/dt$ is the thermal sensitivity of the Bragg wavelength $\lambda_{BRAGG}$ in nm/C.°, $d\lambda_\Phi/dt$ is the thermal sensitivity of the phase matching wavelength in nm/C.°, T is the temperature, and $T_{amb}$ is the ambient temperature.

17. A wavelength conversion device fabricated by the method of claim 1.

* * * * *